United States Patent [19]

Yamaoka et al.

[11] 4,353,954

[45] Oct. 12, 1982

[54] FLEXIBLE PRINTED CIRCUIT BASE BOARD AND METHOD FOR PRODUCING THE SAME

[75] Inventors: Sigenori Yamaoka; Akinobu Kusuhara; Toshinaga Endo, all of Yokohama, Japan

[73] Assignee: Sumitomo Bakelite Company, Limited, Tokyo, Japan

[21] Appl. No.: 191,215

[22] PCT Filed: Jun. 13, 1979

[86] PCT No.: PCT/JP79/00150

§ 371 Date: Feb. 5, 1980

§ 102(e) Date: Feb. 5, 1980

[87] PCT Pub. No.: WO80/00117

PCT Pub. Date: Jan. 24, 1980

[30] Foreign Application Priority Data

Jun. 14, 1978 [JP] Japan ................................ 53-70895

[51] Int. Cl.³ .................... H05K 1/00; B32B 15/08; B32B 27/34; B32B 27/38
[52] U.S. Cl. .................................. 428/216; 428/213; 428/215; 428/209; 428/411; 428/418; 428/458; 428/473.5; 428/474.4; 428/901; 427/96; 427/386; 427/388.1; 427/388.2; 174/68.5
[58] Field of Search .................... 428/473.5, 458, 209, 428/901, 213, 418, 411, 215, 216, 474.4; 427/96, 386, 388.1, 388.2; 174/68.5

[56] References Cited

U.S. PATENT DOCUMENTS

| | | | |
|---|---|---|---|
| 3,932,689 | 1/1976 | Watanabe | 428/473.5 |
| 3,985,928 | 10/1976 | Watanabe | 428/473.5 |
| 4,059,550 | 11/1977 | Shimp | 428/418 |
| 4,118,535 | 10/1978 | Banucci | 428/458 |
| 4,226,913 | 10/1980 | Henderson | 427/388.1 |

Primary Examiner—Ellis P. Robinson
Attorney, Agent, or Firm—Karl W. Flocks; Sheridan Neimark

[57] ABSTRACT

There are disclosed a flexible printed circuit base board produced as an elemental material suitable for a flexible printed circuit board by coating a heat-resistant resin composition composed of a heat-resistant resin having a heterocyclic ring and an epoxy resin dissolved in an organic solvent on a metal foil and drying it to form a film directly on said foil, and a method for producing the same. Said flexible printed circuit base board is more excellent in heat resistance, flame retardancy, adhesiveness, electric insulation, and heat deterioration characteristics than the conventional base board obtained by integrating a heat-resistant film and a metal foil through an adhesive. These properties are of great importance in practical applications of the printed circuit base board. As compared with the conventional products, the production is easy, and hence, the present base board can be produced at a low cost.

This base board is not only usable for various types of flexible printed circuit boards but also the film per se obtained from the base board can be used in a field in which a film is used.

16 Claims, No Drawings

FLEXIBLE PRINTED CIRCUIT BASE BOARD AND METHOD FOR PRODUCING THE SAME

TECHNICAL FIELD

This invention relates to a heat-resistant flexible printed circuit base board produced by forming an electrically insulating coating directly on a metal foil without using any electrically insulating film or a fibrous base material, and to a method for producing the same.

BACKGROUND ART

Increasing requirements are seen recently for simplification of the mounting system, miniaturization, high reliability and high performance of the communication appliances, domestic appliances, electronic computers, and sounding devices, and similar requirements are made of the printed circuit boards incorporated in such appliances.

Among printed circuit boards, flexible printed circuit boards can meet these requirements as they are light in weight, compact in structure, and capable of bending and three-dimensional wiring, and they are recently, therefore, prevalently used as printed circuit boards for a variety of appliances.

As such flexible printed circuit base boards, there have been used the so-called flexible copper-clad laminates obtained by bonding an electrically insulating film such as polyester resin film, polyimide resin film, fluorocarbon resin film, etc., to a copper foil through an adhesive or by bonding to a copper foil a prepreg prepared by impregnating a fibrous base material such as glass cloth, glass non-woven fabric or the like with a heat-resistant resin, such as epoxy resin or the like. However, in the case of bonding an electrically insulating film to a metal foil through an adhesive, the product quality is greatly affected by not only the properties of the film per se but also the properties of the adhesive used, and particularly in the case where the product is based on a film excellent in heat-resistance and dimensional stability, such as polyimide film, the innate properties of the film such as heat-resistance and the like, are attenuated by the adhesive and not utilized to produce the best effect. On the other hand, the copper-clad laminate in which the fibrous base material is used is insufficient in flexibility, such as folding endurance, and often breaks when used in three-dimensional wiring as a printed circuit board, whereby troubles are often caused. There is also known a method of bonding a plastic film, a resin powder or the like to a metal foil by melt-adhesion without using any adhesive, but the films or powders with high heat-resistance have themselves a high melting point and are hard to melt-adhere, so that there are many limitations, such as a specific treatment or a very high temperature pressing equipment is required. Therefore, it is not easy and is very costly to carry out said method on an industrial scale.

On the other hand, when an electric insulating resin is coated in a wet state on the surface of a metal foil and dried to form a coating, and the thus obtained coating per se is used as an electric insulating layer and a support for a flexible printed circuit, the resulting laminate has various advantages as mentioned below as compared with the above-mentioned conventional materials and becomes a very commercially attractive laminate:

(1) Because of use of no adhesive, the properties of the resin per se are retained in their entirety in printed circuit boards.

(2) It becomes unnecessary to subject a film along with a metal foil to pressing step, and hence, the productivity is increased.

(3) The control of the thickness of the coating as an insulating layer and a support can freely be effected to enable the manufacture of a very thin base board.

(4) Continuous production is facilitated. A solution casting method is known for the formation of such a coating, and a varnish of a resin, such as epoxy resin, urethane resin, alkyd resin or the like is known to be able to form a coating on a metal foil by coating the varnish on the metal foil and drying the same.

However, when such a resin is used in the production of a flexible printed circuit base board for the above-mentioned purpose, the following disadvantages are seen:

(1) The coating obtained by application and drying of said resin is, in most cases, poor in mechanical strength, so that it can hardly serve as a supporting film for a flexible printed circuit and cannot withstand the mechanical stress in the subsequent step of processing the printed circuit base board and in the actual use thereof.

(2) Thermoplastic resins which can be easily formed into a film by the solution casting method are usually unsatisfactory in heat-resistance in the processing of the flexible printed circuit base board and in the actual mounting of the resulting printed circuit. In order to overcome these disadvantages, there has recently been proposed a method for manufacturing the flexible printed circuit boards by said solution casting method using a heat-resistant resin having a heterocyclic ring such as polyimide, polyamide-imide, polyesterimide, etc. The use of such a resin results in a film having an excellent heat resistance, but the adhesion of the film to the metal foil becomes unsatisfactory because of shortage of polar groups. Also, when applying such a resin on a metal foil surface and curing it by drying, there takes place cure-shrinkage to cause a great curling of the base board toward the opposite side of the metal foil, that is, the resin film side, whereby the practicability of the printed circuit board becomes unsatisfactory. Such a curling tendency becomes greater by use of resins having a higher molecular weight. If no high molecular weight resin is used, the coating becomes weak in molecular bond, poor in film-formability, inferior in mechanical strength, and brittle. Thus, in the case of using a heat-resistant resin containing a heterocyclic ring, it is impossible to obtain a coating good in all of the film-formability, adhesion to metal foil and curling property, that is, well-balanced in properties, and the resulting laminate lacks practicability.

When only a heat-resistant resin having a heterocyclic ring is used, the adhesion to metal foil is poor because of shortage of polar groups although the heat resistance is excellent. There also appear curls and creases due to cure-shrinkage. Therefore, the present inventors have made extensive studies for overcoming these difficulties without diminishing the heat-resistance of said resin to find that all of these problems can be solved entirely by reacting said resin with an epoxy resin.

OBJECTS

An object of this invention is to provide a novel flexible printed circuit base board free from the above-mentioned disadvantages.

A further object of this invention is to provide a novel flexible printed circuit base board in which no adhesive is used and the characteristics of the base board resin are retained as they are, the supporting film of which is high in adhesiveness and in mechanical strength, and which is free from curl and has very excellent practical characteristics.

Other objects and advantages of this invention will be apparent from the following description.

DISCLOSURE OF INVENTION

According to this invention, there is provided a flexible printed circuit base board, characterized by comprising a metal foil and a film of a second resin consisting essentially of the reaction product of a first heat-resistant resin having a molecular weight of at least about 5,000 and a heterocyclic ring and an epoxy resin having at least two epoxy groups in the molecule, said metal foil and said film of second resin being bonded directly to each other through no adhesive, and a method for producing the flexible printed circuit base board is also provided.

BEST MODE FOR CARRYING OUT THE INVENTION

This invention is explained below in detail.

A typical example of reactions between a first heat-resistant resin having a heterocyclic ring and an epoxy resin are diagrammatically shown below.

from the use of the first heat-resistant resin alone. Also, since there takes place cross-linking due to the formation of a three-dimensional structure of the second resin during curing as seen in the above exemplification, it is possible to inhibit the cure-shrinkage which occurs extensively when using a linear polymer alone. In fact, almost no crease, curl or other deformation was surprisingly found in experiments. It was also found as to film-formability that the film is formed more rapidly and the formed film is higher in mechanical strength when using a high molecular weight resin than when using a low molecular weight resin. This results from the difference in intermolecular bonding force between (1) the method in which the formation of a high polymer is performed in a dynamic state by agitation under heating and (2) the method in which the formation of a high polymer is carried out in a static state under heating, and obviously, the method (1) can provide a stronger intermolecular bonding force. In this invention, the method (1) can provide a stronger intermolecular bonding force. In this invention, the method (1) corresponds to the resin synthesis stage and the method (2) to the stage of casting the resin solution on a metal foil.

The present inventors have found that the higher the molecular weight of the resin to be cast on a metal foil, the higher the mechanical strength of the resulting film. Although cure-shrinkage takes place to a greater extent when using a linear high polymer of a heat-resistant resin alone as pointed out above, a success has been accomplished in this invention in inhibiting such a shrinkage by inducing three-dimensional cross-linking by a reaction with an epoxy resin as illustrated in the above reaction formulae.

As described above, the use of the resin of this invention enables the solution of the difficult problems, such as bonding strength, curling and creasing, which were

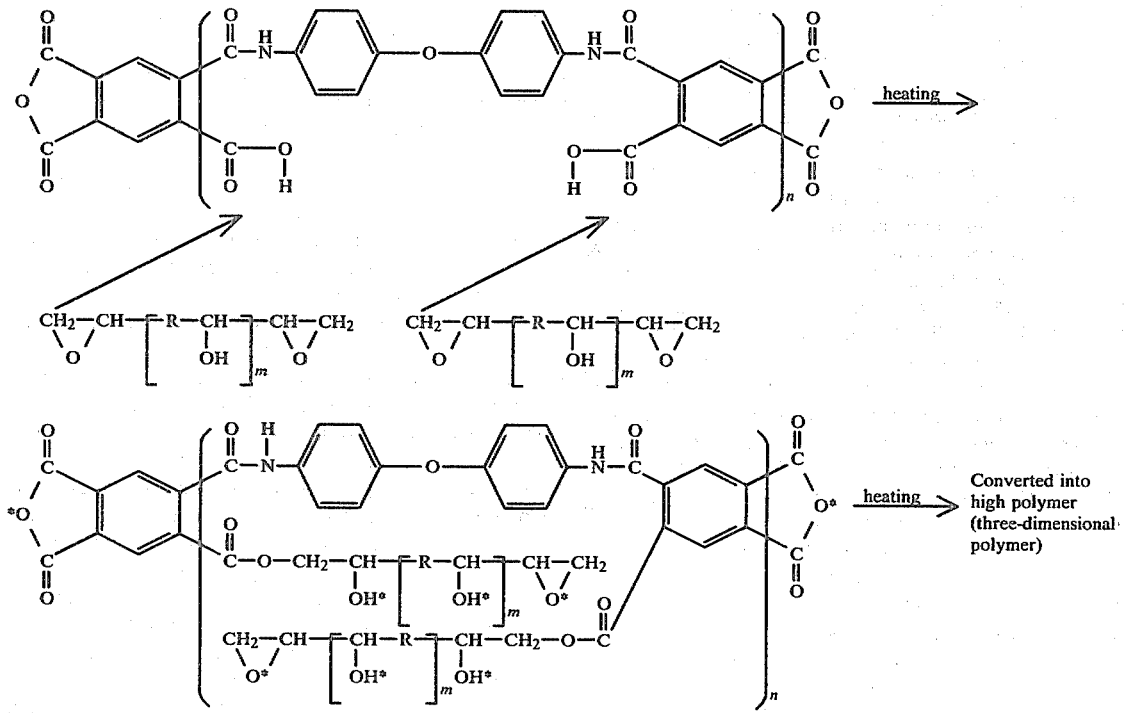

*polar group

As seen from the above reaction formulae, the first heat-resistant resin reacted with an epoxy resin is amazingly increased in the number of polar groups, resulting in so strong an adhesion to metal foil that cannot result disadvantages of the heat-resistant resins, with retaining their heat-resistance and also enables the production of a printed circuit board having an extremely rich practicability. Further, since the second resin viscosity is lowered by mixing or reacting a first heat-resistant resin with an epoxy resin which is lower in molecular weight than the first heat-resistant resin, the casting of the second resin composition on a metal foil is facilitated and the surface of the cast film is made uniform and the quality as a film is enhanced and the thickness precision of the film is enhanced simultaneously.

The metal foil used in this invention is a conventional metal foil having a good electrical conductivity, such as copper foil, aluminum foil, nichrome foil, nickel foil, titanium foil, etc. The metal foil thickness is preferably within the range of 1 to 150μ, and if necessary, the surface thereof may be plated with gold, nickel, solder, etc. Also, the metal foil surface may be mechanically roughened by grinding or the like, or a chemical treatment with a chromic acid-sulfuric acid solution or the like may be applied to the metal foil surface in order to further enhance the bonding strength.

As the first heat-resistant resins having a heterocyclic ring, there may be used polyimide, polyamide-imide, polyesterimide, polyesteramide-imide, polyhydantoin, polyimidazopyrrolone, polybenzimidazole, polyparabanic acid imide, polyparabanic acid, polythiazole, polybenzothiazole, polyquinoxaline, polyoxadiazole and the like, and their copolymers. The molecular weight of said heat-resistant resin is at least about 5,000. Although there is no specific upper limit of molecular weight of said first heat-resistant resins, the molecular weight is preferably within the range of about 5,000 to 200,000, more preferably about 8,000 to 100,000. As mentioned above, the resins of a high molecular weight have a good film-formability, and particularly, when those having a molecular weight of about 5,000 or more is used, the resulting film is excellent in mechanical strength such as tensile strength and the like. When a first resin having a molecular weight of less than 5,000 is used, the resulting film is brittle and unsatisfactory as a support for the printed circuit board.

As the epoxy resin, there is used a reactive polyepoxy compound or a reactive polyglycidyl compound having at least two epoxy groups in the molecule. For example, diglycidyl ethers derived from bisphenols or halogenated bisphenols; glycidyl ethers derived from cycloaliphatic polyepoxy compounds, novolak resins, polyphenol or polyhydroxyphenol; glycidyl ethers or esters derived from aromatic oxycarboxylic acids or aromatic carboxylic acids; glycidyl esters of dimeric acids; glycidyl ethers of polyalkylene glycols; or their rubber- or urethane-modified compounds thereof may be used either alone or in admixture of two or more.

If necessary, a small quantity of a low molecular weight monoepoxy compound may be used jointly.

It is preferable that the above-mentioned epoxy resin has a molecular weight of from about 800 to 10,000. As mentioned above, like the heat-resistant resins, an epoxy resin having a high molecular weight is rich in film-formability, and particularly when an epoxy resin having a molecular weight of at least 800 is used, the resulting film is excellent in mechanical strength such as tensile strength and the like. When an epoxy resin having a molecular weight of less than about 800 is used, the resulting film is brittle and is unsatisfactory as support for the printed circuit board.

In addition to them, there may be added small amounts of acid-curing agent, amine-curing agent, polyamide-curing agent or a curing accelerator such as imidazole, tertiary amine or the like. Further, there may be added a flexibility-imparting agent such as polysulfides, polyesters, or the like, antioxidants such as diphenylamine, butylphenol or the like, fillers such as talc, clay mica, powdered feldspar, pulverized quartz, magnesium oxide or the like, coloring matters such as carbon black, ferroxyanine blue, or the like, flame retardants such as tributyl phosphate, tetrabromodiphenylmethane or the like, or flame retardant adjuvants such as antimony trioxide, barium methaborate, or the like. Addition of these materials enables the product to be applied to special uses as printed circuit board.

As to the blending ratio of said resins, the proportion of an epoxy resin is preferably 0.1 to 30 parts by weight, more preferably 1 to 15 parts by weight, per 100 parts by weight of a first heat-resistant resin having a heterocyclic ring. It is preferable that these resins are not only simply mixed but also agitated at 15° to 150° C. for 30 minutes to 10 hours before casting the mixture on the metal foil surface. The second resins obtained by reacting the two resins in a proportion within this range are rich in film-formability, and at the same time, the resulting film has a sufficient mechanical strength as a support for printed circuit board. Said film also has an excellent adhesiveness and the resulting laminate is free from curl or crease in appearance. Further, since no adhesive is used, the innate properties of the heat-resistant resin are retained in their entirety and hence the resulting laminate is superior to the conventional adhesive-containing laminate in all respects of the machanical, chemical and physical properties at high temperatures. This invention is epoch-making in that heat deterioration of bonding strength is amazingly lessened, and this can greatly expand the scope of a variety of appliances in which the printed circuit boards are to be mounted. If the amount of the epoxy resin is less than 0.1 part by weight, there takes place no crosslinking of the heat-resistant resin as shown in the reaction formulae and merely a linear polymer is formed, and when cured, said polymer shrinks to give rise to curls and creases which become serious defects as printed circuit board. On the other hand, if the amount of the epoxy resin is more than 30 parts by weight, its miscibility with the heat-resistant resin becomes low, and a homogeneous mixture is difficult to obtain, resulting in the worsened film-formability.

The resin composition of this invention is soluble in a suitable organic solvent, for example, dimethylacetamide, dimethylformamide, dimethylsulfoxide, N-methylpyrrolidone, γ-butyrolactone, caprolactone, pyridine, piperidine, phenol, cresol, dichloromethane, dioxane, tetrahydrofuran, toluene, xylene, solvent naphtha, ketones including acetone, methyl ethyl ketone, and the like, alcohols including methyl alcohol, ethyl alcohol or the like, or mixtures thereof.

The method for producing the printed circuit base board comprises dissolving the resin composition in a solvent to a concentration of 5 to 70% by weight, then casting or coating this solution in a uniform thickness of 0.5 to 300μ on the surface of a metal foil, and then drying the coated metal foil in a drier at a temperature of 50° to 450° C., if necessary in two or more stages, for 2 minutes to 25 hours to form a resin film. As the coating or casting means, there may be used a roll coater, doctor blade, spinner, a flow coater, etc., and the drying may be accomplished by means of an infrared ray, steam or high frequency alone or in combination.

Not only can the base board of this invention be used as it is for a variety of flexible printed circuit boards but the film per se obtained by eliminating the metal foil from the base board can also be used in uses for films. For example, the base board can be used in a wide field including flexible flat cables, flexible surface heaters, memory elements, busbars, transducers, motor coils, condensers, magnetic tapes, printed board cover lay films, etc.

This invention is described more specifically below with reference to Examples, but this invention is not limited by the Examples.

EXAMPLE 1

With 100 parts by weight of a polyimide resin (molecular weight: 12,000) obtained by polycondensing 2 moles of pyromellitic anhydride and 1 mole a diaminodiphenylmethane in N-methylpyrrolidone was reacted at 80° C. for 3 hours 10 parts by weight of a bisphenol A type epoxy resin (molecular weight: 1,880) obtained by reacting 1 mole of bisphenol A and 1 mole of propylene oxide by using caustic potash as catalyst, to obtain a resin with an intrinsic viscosity of 1.8 at 25° C.

This resin was dissolved in a mixed solvent of 5 parts by weight of N-methylpyrrolidone and 1 part by weight of xylene and diluted to a concentration of 30% by weight, and the solution was coated on a 35 $\mu$-thick copper foil to a coating thickness of about 10$\mu$ by means of a flow coater, followed by drying for 30 minutes at 250° C., to form a film, whereby a flexible copper-clad laminate was obtained.

The performance of this copper-clad laminate in use as printed circuit board and the performance of the film as obtained by etching the copper foil off with a ferric chloride solution of 40° Be' are shown in Table 1.

EXAMPLE 2

With 100 parts by weight of a polyamide-imide resin (molecular weight: 21,000) obtained by addition-polymerizing 2 moles of trimellitic anhydride and 3 moles of diphenylmethane diisocyanate in N-methylpyrrolidone was reacted at 100° C. for one hour 5 parts by weight of a bisphenol A type epoxy resin (molecular weight: 950) obtained by reacting 1 mole of bisphenol A and 1 mole of ethylene oxide by using caustic potash as a catalyst, to obtain a resin with an intrinsic viscosity of 1.5 at 25° C.

This resin was diluted with N-methylpyrrolidone to a concentration of 15% by weight and coated on a 35 $\mu$-thick copper foil to a coating thickness of about 5$\mu$ by means of a flow coater, followed by drying at 150° C. for 10 minutes and additional drying at 220° C. for 60 minutes to form a film, thereby producing a flexible copper-clad laminate.

The performance of this copper-clad laminate in use as a printed circuit board and the performance of the film obtained by etching the copper foil off in the same manner as in Example 1 are shown in Table 1.

EXAMPLE 3

With 100 parts by weight of a polyesterimide (molecular weight: 25,000) obtained by reacting 1 mole of diaminodiphenyl ether with an adduct obtained by reacting 1 mole of trimellitic anhydride and 1 mole of hydroquinone diacetate in cresol was reacted 15 parts by weight of a brominated bisphenol A type resin (molecular weight: 1,350) obtained by reacting 1 mole of brominated bisphenol A and 1 mole of ethylene oxide by using caustic potash as a catalyst, to obtain a resin with an intrinsic viscosity of 2.0 at 25° C.

This resin was diluted with dimethylformamide to obtain a solution having a concentration of 40% by weight and this was coated on a 20 $\mu$-thick aluminum foil to a coating thickness of about 30$\mu$ by means of a flow coater, followed by drying at 100° C. for 60 minutes and additional drying at 150° C. for 120 minutes to form a film, thereby producing a flexible aluminum-clad laminate.

The performance of this aluminum-clad laminate is use as a printed circuit board and the performance of the film obtained from the laminate by etching in the same manner as in Example 1 are shown in Table 1.

EXAMPLE 4

A copper-clad laminate was prepared in the same manner as in Example 2, except that 100 parts by weight of the same polyamide-imide resin as in Example 2 and 40 parts by weight of the same epoxy resin as in Example 2 were used, and a film was obtained from the laminate by etching.

The performances of the two products are shown in Table 1.

EXAMPLE 5

A flexible copper-clad laminate was prepared in the same manner as in Example 2, except that the same polyamide-imide resin as in Example 2 and an epoxy resin (molecular weight: 390) obtained from the same materials as in Example 2 were used, and a film was obtained from the laminate by etching.

The performances of the two products are shown in Table 1.

Comparative Example 1

A flexible copper-clad laminate was prepared in the same manner as in Example 1, except that the same polyimide resin as in Example 1 was used alone, and a film was obtained from the laminate by etching.

The performances of the two products are shown in Table 1.

Comparative Example 2

A flexible copper-clad laminate was prepared in the same manner as in Example 2, except that the same polyamide-imide resin as in Example 2 was used alone, and a film was obtained from the laminate by etching.

The performances of the two products are shown in Table 1.

Comparative Example 3

In acetone were dissolved 40 parts by weight of a bisphenol A type epoxy resin (Epikote #828 by Shell), 30 parts by weight of maleic anhydride and 30 parts by weight of acrylonitrile-butadiene rubber to a concentration of 40% by weight and the solution was coated on a 20 $\mu$-thick polyimide film (Capton H by Du Pont) to a coating thickness of about 30$\mu$. After drying for 5 minutes at 130° C., the 35 $\mu$-thick copper foil with the coated polyimide film was passed between rolls to press the assembly under heating to form a copper-clad laminate. This laminate was after-baked at 130° C. for 10 hours to completely cure the adhesive.

The performance of the copper-clad laminate in use as a printed circuit board and the performance of an adhesive-containing film obtained from the laminate by etching in the same manner as in Example 1 are shown in Table 1.

Comparative Example 4

A flexible copper-clad laminate was obtained in the same manner as in Example 1, except that a polyimide resin (molecular weight: 3,200) obtained by polycondensing 2 moles of pyromellitic anhydride and 1 mole of diaminodiphenyl methane in N-methylpyrrolidone and the same epoxy resin as in Example 1 were used, and a film was prepared from the laminate by etching.

The performances of the two products are shown in Table 1.

TABLE 1

| Classification | Test item | Unit | Standard | Treatment & conditions | Example 1 | Example 2 | Example 3 | Example 4 | Example 5 | Comp. Ex. 1 | Comp. Ex. 2 | Comp. Ex. 3 | Comp. Ex. 4 |
|---|---|---|---|---|---|---|---|---|---|---|---|---|---|
| Performance in use as printed circuit board | Insulating resistance | Ω | JIS.C-6481 | A<br>D-2/100<br>A<br>C-96/40/90 | $3 \times 10^{14}$<br>$1 \times 10^{14}$<br>$8 \times 10^{14}$<br>$3 \times 10^{14}$ | $2 \times 10^{14}$<br>$8 \times 10^{13}$<br>$5 \times 10^{14}$<br>$3 \times 10^{14}$ | $9 \times 10^{13}$<br>$7 \times 10^{13}$<br>$2 \times 10^{15}$<br>$6 \times 10^{14}$ | $3 \times 10^{14}$<br>$7 \times 10^{13}$<br>$9 \times 10^{13}$<br>$5 \times 10^{13}$ | $1 \times 10^{14}$<br>$7 \times 10^{13}$<br>$9 \times 10^{14}$<br>$2 \times 10^{14}$ | $7 \times 10^{13}$<br>$2 \times 10^{13}$<br>$1 \times 10^{13}$<br>$6 \times 10^{13}$ | $8 \times 10^{13}$<br>$6 \times 10^{13}$<br>$2 \times 10^{14}$<br>$8 \times 10^{13}$ | $8 \times 10^{11}$<br>$1 \times 10^{11}$<br>$2 \times 10^{12}$<br>$5 \times 10^{11}$ | $6 \times 10^{13}$<br>$4 \times 10^{13}$<br>$8 \times 10^{13}$<br>$7 \times 10^{13}$ |
| | Surface resistance | Ω | JIS.C-6481 | | | | | | | | | | |
| | Peel strength | kg/cm | JIS.C-6481 | A 180° direction<br>90° direction | 2.7<br>2.6 | 2.8<br>2.5 | 3.2<br>3.0 | 2.3<br>2.1 | 2.0<br>1.8 | 1.3<br>0.9 | 1.1<br>0.6 | 1.0<br>1.3 | 2.5<br>2.1 |
| | Solvent resistance | — | JIS.C-6481 | Immersed in trichlene, acetone, methylene chloride at room temp. for 15 min. | No change | No change | No change | No change | No change | No change | No change | No change | No change |
| | Chemical resistance | — | JIS.C-6481 | 10% sodium hydroxide 10% hydrochloric acid room temp., 15 min. | No change | No change | No change | No change | No change | No change | No change | No change | No change |
| | Soldering heat resistance | — | JIS.C-6481 | Solder bath A<br>260° C. C-24/40/90 after treatment | No change<br>No change | No change<br>No change | No change<br>No change | No change<br>No change | No change<br>No change | No change<br>No change | No change<br>No change | No change<br>No change | No change<br>No change |
| Performance as film | Dimensional stability | % | IPC.FC-240 | E-48/125 Longitudinal<br>Transverse | 0.02<br>0.02 | 0.02<br>0.01 | 0.03<br>0.01 | 0.03<br>0.04 | 0.04<br>0.02 | 0.3<br>0.4 | 0.5<br>0.4 | 0.02<br>0.3 | 0.03<br>0.02 |
| | Warp | % | JIS.K-6911 | A | 0.2 | 0.2 | 0.1 | 0.1 | 0.2 | 6.2 | 6.0 | 0.2 | 0.2 |
| | Tensile strength | kg/mm² | JIS.K-6760 | A | 16 | 15 | 15 | 13 | 11 | 15 | 16 | 8 | 10 |
| | Folding endurance | Number of foldings | JIS.P-8115 | A | 5000 or more | 5000 or more | 5000 or more | 5000 or more | 2500 | 5000 or more | 5000 or more | 5000 or more | 2100 |
| | Water absorption | % | JIS.K-6911 | D-24/23 | 1.0 | 1.0 | 1.7 | 2.1 | 1.9 | 3.1 | 3.0 | 3.5 | 2.0 |
| | Pyrolysis starting temperature | °C. | (Differential thermal balance) | Temp. elevation rate: 5° C./min. | 400 | 400 | 400 | 320 | 400 | 400 | 400 | 270 | 400 |

Note:
(1) The film in Comparative Example 3 contained adhesive.
(2) Test piece size for warp test was 250 × 250 mm.

As seen from Table 1, the metal-clad laminate obtained according to this invention (Examples 1-5) have the well-balanced properties and every required performance for use as printed circuit boards. As compared with the conventional adhesive-containing product (Comparative Example 3), these products are greatly improved in electrically insulating performance and more than about twice as high in peel strength as the conventional one. Thus, the products of this invention can be used with a high reliability in the applications where the conventional printed circuit boards using the super-fine wires (less than 0.1 mm in circuit width) were quite unsatisfactory because of frequent troubles such as peeling of circuit wires. This will prove to be a great merit to the industry in view of the current trend toward use of hyper-fine wires for the printed circuit boards.

Since in this invention, the cure-shrinkage is inhibited by the formation of a three-dimensional structure resin, not only is the dimensional change very small, but also substantially no crease or curl is formed which is a serious defect of the printed circuit boards. This feature is an important requirement in processing a metal-clad laminate into a printed circuit board and implies possibility of a drastic improvement of yeild. Further, the film per se has very high mechanical strength and can well serve as a support for printed circuit boards. Particularly higher strength is noted in the products using a higher molecular weight resin (Examples 1-3). This enables cost reduction in manufacture of film per se, allowing adaptation of such films to a variety of products such as motor coils, condensers, magnetic tapes, etc. The boards obtained without reacting an epoxy resin with a heat-resistant resin (Comparative Examples 1-2) are very poor in peel strength and subject to an excessive degree of warp, so that their practical use is limited to a very narrow range. Thus, such boards have less merits than the conventional film-based products and the warp thereof may become a fatal defect.

As described above, the metal foil-resin laminate of this invention is not only appliable to the conventional uses as the flexible printed circuit base board but can also find a new field of applications, and can also impart to products excellent and well-balanced performances in heat resistance, electric insulation, flexibility, film strength, non-directionality, dimensional stability, adhesiveness and other properties, and further, is very small in reduction of various performances such as electrically insulating performance, dielectric characteristics, bonding strength and the like in use at high temperatures. In addition, even super-thin films of about 1 to 10μ thickness can be produced from the above laminate on an industrial scale at low cost. Therefore, the laminate is a very useful material in practice.

We claim:

1. A method for producing a flexible printed circuit base board, characterized by
 coating an organic solvent solution of a second heat-resistant resin consisting essentially of the reaction product of (1) a first heat-resistant resin having a molecular weight of at least about 5,000 and a heterocylic ring, selected from the group consisting of polyimide, polyesterimide, polyhydantoin, polyimidazopyrrolone, polybenzimidazole and polyparabanic acid imide, these having in their molecule groups reactive with epoxy group, with (2) an epoxy resin having at least two epoxy groups in the molecule, on a metal foil having good electrical conductivity and a thickness of 1 to 150μ; and drying and curing the same to form a flexible cured film of said resin composition having a thickness of 0.5 to 300μ on said metal foil surface.

2. A method for producing a flexible printed circuit base board according to claim 1, wherein the epoxy resin containing at least two epoxy groups in the molecule has a molecular weight of not less than about 800.

3. A method for producing a flexible printed circuit base board according to claim 1 or 2, wherein a resin composition consisting of 100 parts by weight of a heat-resistant resin having a molecular weight of not less than about 5,000 and a heterocyclic ring and 0.1 to 30 parts by weight of an epoxy resin containing at least two epoxy groups in the molecule is used.

4. A method according to claim 1 wherein said organic solvent solution of said second resin composition is formed by first heating while agitating to effect reaction between said first resin and said epoxy resin; and the resultant second resin composition is then admixed with said organic solvent.

5. A method according to claim 4 wherein said solvent is selected from the group consisting of dimethylacetamide, dimethylformamide, dimethylsulfoxide, N-methylpyrrolidone, γ-butyrolactone, caprolactone, pyridine, piperidine, phenol, cresol, dichloromethane, dioxane, tetrahydrofuran, toluene, xylene, solvent naphtha, ketones including acetone, methyl ethyl ketone, alcohols including methyl alcohol, ethyl alcohol, and mixtures thereof.

6. A method according to claim 4 wherein said organic solvent solution of said second resin composition comprises 5-70% by weight of said resin composition.

7. A method according to claim 4 wherein said first heat-resistant resin and said epoxy resin are agitated at 15° to 150° C. for thirty minutes to ten hours.

8. A method according to claim 7 wherein said drying and curing is effected at a temperature of 50° to 450° C. for two minutes to twenty-five hours.

9. A flexible printed circuit base board consisting essentially of a metal foil having good electrical conductivity and a thickness of 1 to 150μ; and a flexible film of a cured resin consisting essentially of the reaction product of a heat-resistant resin having a molecular weight of at least about 5,000 and a heterocyclic ring, selected from the group consisting of polyimide, polyesterimide, polyhydantoin, polyimidazopyrrolone, polybenzimidazole and polyparabanic acid imide, these having in their molecule groups reactive with epoxy group, and an epoxy resin containing at least two epoxy groups in the molecule, said film having a thickness of 0.5 to 300μ, said metal foil and said resin film being bonded directly to each other through no adhesive, and wherein said metal foil is selected from the group consisting of copper foil, aluminum foil, nicrome foil, nickel foil, and titanium foil.

10. A flexible printed circuit base board according to claim 9 wherein said foil is metal-plated.

11. A flexible printed circuit base board according to claim 9 wherein said metal foil surface in contact with said film of cured resin is roughened.

12. A flexible printed circuit base board according to claim 9 wherein said heat-resistant resin having a heterocyclic ring is selected from the group consisting of polyimide, and polyesterimide.

13. A flexible printed circuit base board according to claim 9 wherein said said heat-resistant resin has a molecular weight of about 5,000 to 200,000.

14. A flexible printed circuit base board according to claim 13 wherein said heat-resistant resin has a molecular weight of 8,000 to 100,000.

15. A flexible printed circuit base board according to claim 13 wherein said epoxy resin has a molecular weight of from about 800 to 10,000.

16. A flexible printed circuit base board according to claim 9 wherein said flexible cured resin film further contains a small amount of at least one adjuvant selected from the group consisting of a flexibility-imparting agent, an anti-oxidant, a filler, a coloring material, a flame retardant, and mixtures thereof.

* * * * *